United States Patent [19]

McElroy

[11] 4,151,020

[45] Apr. 24, 1979

[54] HIGH DENSITY N-CHANNEL SILICON GATE READ ONLY MEMORY

[75] Inventor: David J. McElroy, Houston, Tex.

[73] Assignee: Texas Instruments Incorporated, Dallas, Tex.

[21] Appl. No.: 762,612

[22] Filed: Jan. 26, 1977

[51] Int. Cl.² .................... H01L 21/225; H01L 21/26
[52] U.S. Cl. ..................................... 148/187; 148/1.5; 148/188; 148/189; 29/569 L; 29/577 R; 29/577 C; 357/45
[58] Field of Search .................. 357/45; 148/187, 188, 148/1.5; 29/569 L, 577 R, 577 C

[56] References Cited

U.S. PATENT DOCUMENTS

| 3,914,855 | 10/1975 | Cheney et al. | 148/1.5 X |
| 3,921,282 | 11/1975 | Cummingham et al. | 148/187 X |
| 4,055,444 | 10/1977 | Rao | 148/187 X |
| 4,075,045 | 2/1978 | Rideout | 148/1.5 X |

*Primary Examiner*—G. Ozaki
*Attorney, Agent, or Firm*—John G. Graham

[57] ABSTRACT

An N-channel silicon gate read only memory or ROM array of very high bit density is made by providing columns in the form of parallel N+ moats separated by field oxide and removing small areas of the field oxide in a pattern of "1's" and "0's" according to the ROM program. Gate oxide is grown in the areas where field oxide is removed, and parallel polycrystalline silicon strips are laid down over the field oxide and gate oxide areas normal to the moats, providing the rows. The ROM may be made as part of a standard double level poly, N-channel, self-aligned silicon gate process. The columns may include an output line and several intermediate lines for each ground line so that a virtual ground format is provided. An implant step may be used to avoid the effects of exposed gate oxide so that zero-overlap design rules are permitted.

12 Claims, 8 Drawing Figures

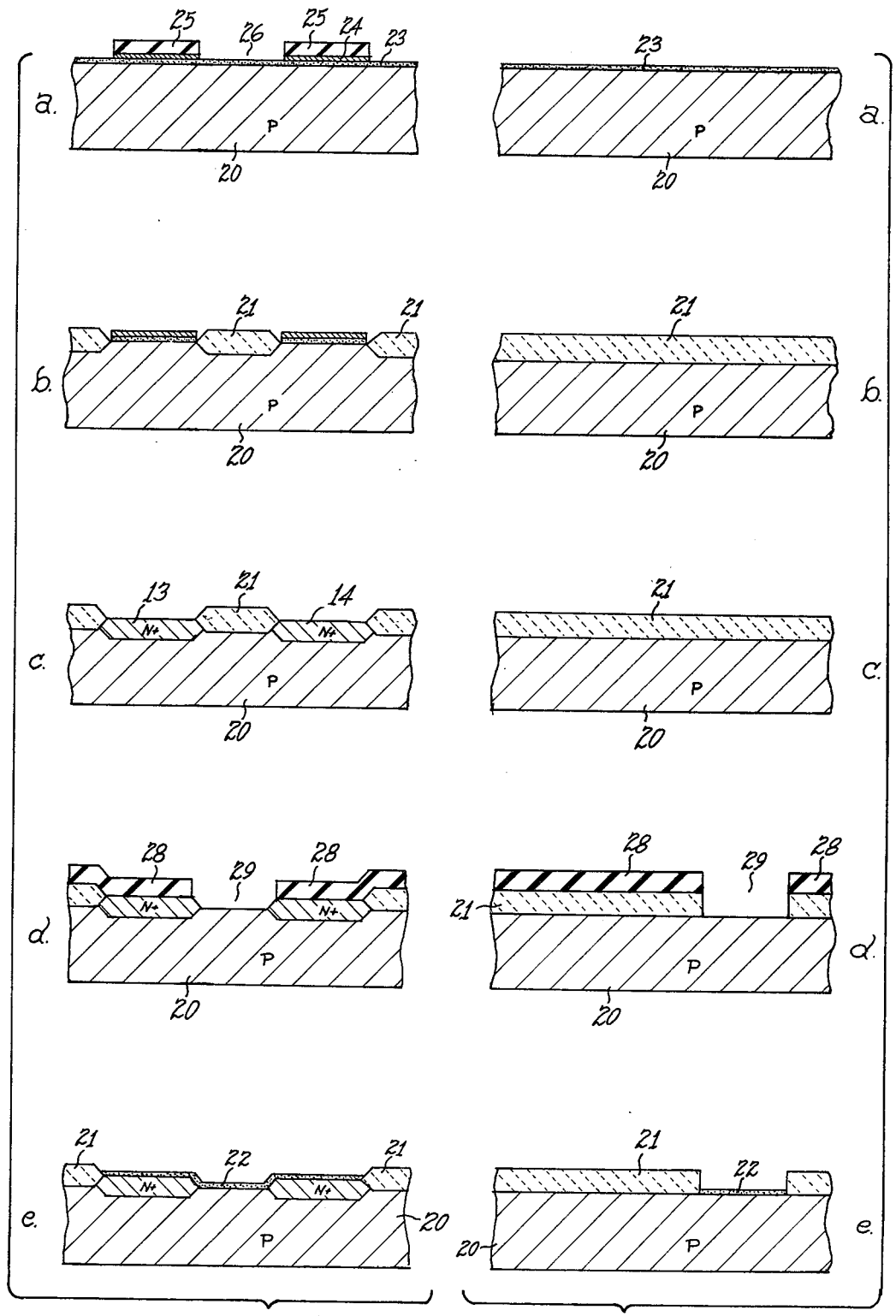

HIGH DENSITY N-CHANNEL SILICON GATE READ ONLY MEMORY

BACKGROUND OF THE INVENTION

This invention relates to semiconductor memory devices, and more particularly to a high density N-channel silicon gate MOS read only memory and a process for making it.

Semiconductor memory devices are widely used in the manufacture of digital equipment, particularly minicomputers and microprocessor systems. Often bulk storage of fixed programs is provided by MOS read only memory devices or "ROMS." The economics of manufacture of these devices, and of mounting them on circuit boards in the system, are such that the number of memory bits per semiconductor chip is advantageously as high as possible. ROMs of 8 K and 16 K sizes are typical, these referring to 8192 or 16384 bits per chip. This dictates that cell sizes for the storage cells of the ROM be quite small. P-channel ROMs of this size can be relatively easily fabricated in the manner set forth in U.S. Pat. No. 3,541,543, assigned to Texas Instruments. However, most microprocessor and computer parts are now made by the N-channel silicon gate process because of the shorter access times provided. The N-channel process is not favorable to layout of ROM cells of small size. Prior cells have required contact areas between metal or polysilicon lines and the semiconductor material, using excessive space on the chip, or metal leads have been used in the array, which introduces unwanted capacitance. Other cells have been of slow operating speed, had high series resistance, or required processing not compatible with standard manufacturing techniques. Further, it has not been possible to use an implant to correct misalignment which exposes gate oxide, so overlap was needed in the design rules. Exemplary prior N-channel, silicon gate ROMs are disclosed in U.S. Pat. No. 4,059,826, issued to G. D. Rogers, and application Ser. No. 701,932, filed July 1, 1976 by G. R. Mohan Rao (now abandoned and included in continuation-in-part application Ser. No. 841,502, filed Oct. 11, 1977) all assigned to Texas Instruments.

It is the principal object of this invention to provide a semiconductor read only memory cell of small size. Another object is to provide a small-area, N-channel, silicon gate MOS ROM cell which is made by a process compatible with standard manufacturing techniques.

SUMMARY OF THE INVENTION

In accordance with an embodiment of the invention, a metal-oxide-semiconductor read only memory, or MOS ROM, is formed by an array of potential MOS transistors where polysilicon strips on a silicon chip define the address lines, and output and ground lines (as well as sources and drains of the transistors) are defined by N+ diffused regions perpendicular to the address lines. In the array, each potential MOS transistor is a storage cell, with each cell being programmed to store a logic "1" or "0" by providing either a thin oxide gate region beneath a polysilicon address line or leaving thick field oxide in place. No metal or polysilicon to silicon contacts are needed in the cell and the resulting cell size is quite small.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein;

FIGS. 4a–4e and 5a–5e are elevation views in section of the semiconductor device of FIGS. 1 and 3a–3d, at successive stages in the manufacturing process, taken along the line a—a and d—d, respectively in FIG. 1.

DETAILED DESCRIPTION OF SPECIFIC EMBODIMENT

Figure 1:
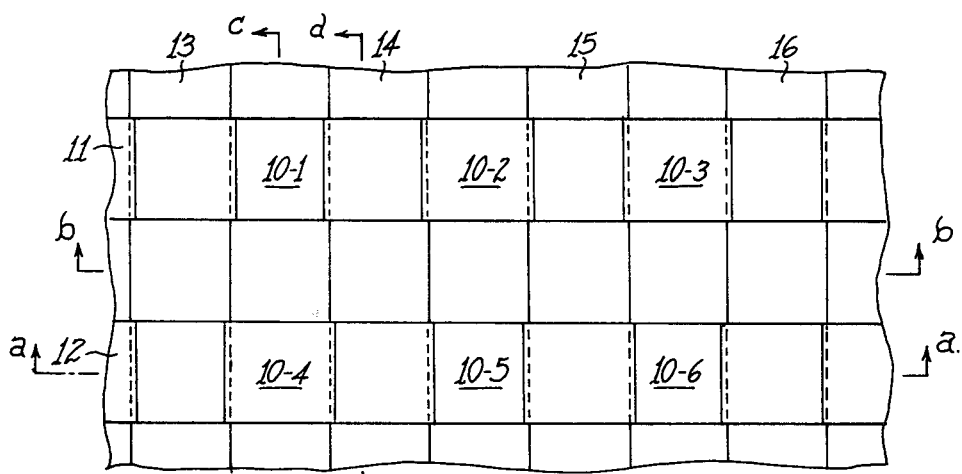
FIG. 1 is a greatly enlarged plan view of a small portion of a semiconductor chip showing the physical layout of a part of a ROM array made according to the invention.
Figure 2:
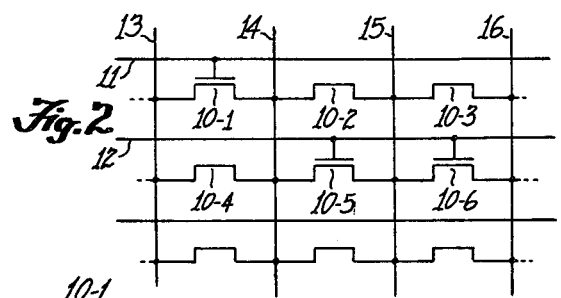
FIG. 2 is an electrical schematic diagram of the ROM of FIG. 1.
Figure 3A:
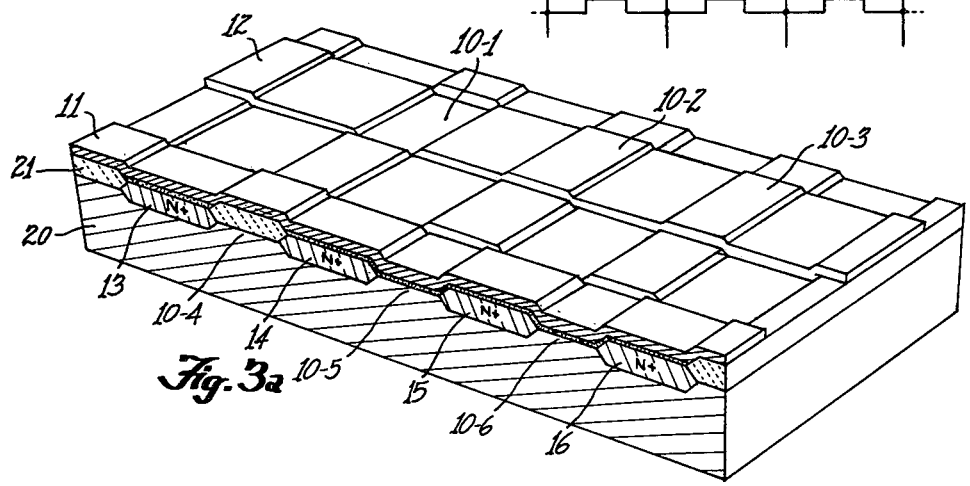
FIGS. 3a–3d are elevation views in section of the cell of FIG. 1, taken along the lines a—a, b—b, c—c, and d—d, respectively.
Figure 3B:
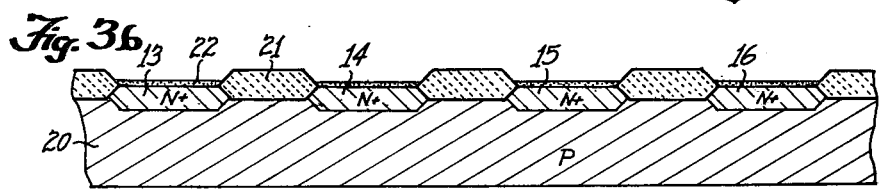
Figure 3C:
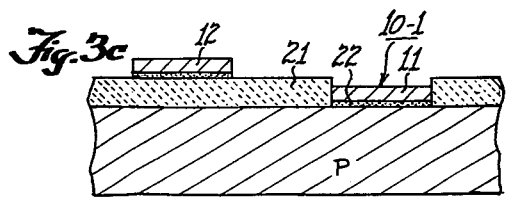
Figure 3D:
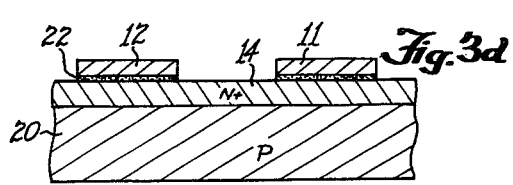

Referring to FIG. 1, a layout of a small part of an N-channel MOS ROM is shown. Although only six cells 10 are shown, usually the ROM would contain some large power of two, such as $2^{14}$ or 16384, $2^{16}$ or 65536, etc. cells on a chip of perhaps 150 mils on a side. Each cell is about 0.25 mil sq. or less. Decoders, input/output circuits, the clock generators would be also on the chip. FIG. 2 shows the six cells of FIG. 1, but in electrical schematic form. The ROM consists of cells 10-1 to 10-6 located at the intersections of polysilicon lines 11 and 12 and potential MOS transistor cell areas defined between N+ diffused regions 13, 14, 15, and 16. Using a decoder of the type shown at FIG. 14 of U.S. Pat. No. 3,991,305, issued Nov. 9, 1976 to J. H. Raymond and E. R. Caudel, assigned to Texas Instruments, one of the lines 13-16 is connected to ground or Vss, while an adjacent one of the lines is treated as an output line. The ROM is thus of the "virtual" ground type. The elected output line would be connected to a load device which would hold it at Vdd except when the selected cell grounded it to a Vss line. The lines 11 and 12 would be connected to an X address decoder in accord with standard practice, which would select only one of the lines to go to Vdd, or about 10 to 12 volts, for a given address. The others would remain at Vss. In a 16 K ROM, for example, there may be 128 row lines like lines 11 and 12; likewise, there would be 128 "Y" or column lines like 13-16, usually grouped to provide a sixteen bit word, as an example. In the segment shown, cells 10-1, 10-3, 10-5 and 10-6 are programmed as zeros, the remainder as ones.

The structure of the device of FIGS. 1 and 2 is best understood by reference to FIGS. 3a–3d, which are sectional views showing some of the potential MOS transistors realized as devices and some not. The device is fabricated on a P-type silicon chip 20, and the N+ diffused (or implanted) regions 13, 14, 15 and 16 extend into the surface of the chip, between sections of a field oxide layer 21. Where a gate of a potential field effect transistor is realized, the field oxide 21 is removed and a thin oxide layer 22 provides a gate insulator. The polysilicon strips 11 and 12 extend along the chip on top of the field oxide 21, except at the positions 10-1, 10-3, 10-5 and 10-6 where zeros are programmed, and here the polysilicon dips down to the level of the gate oxide 22, seen in FIGS. 3a and 3d. The cell size of the ROM of FIG. 1 is less than 0.25 sq. mil per bit, which is less than half that of N-channel ROMs made by other techniques.

Referring now to FIGS. 4a–4d and 5a–5d, a process for making the N-channel, silicon-gate MOS integrated circuit device of FIGS. 1 and 3a–3d will be described. The process is the same as a conventional N-channel, double-level polysilicon gate self-aligned process except for the way the cells are formed by etching away the field oxide. In areas on the chip away from the cell array, double-level poly MOS transistors of conventional form would be employed in decoders, buffers, clock generators, etc. The starting material is a slice of P-type monocrystalline silicon, perhaps 3 inches in diameter and 20 to 40 mils thick, cut on the <100> plane, of a resistivity of about 6 to 8 ohm-cm. In the FIGURES, the chip or bar 20 represents a very small part of the slice, perhaps 1 or 2 mils wide. After appropriate cleaning, the slice is oxidized by exposing to oxygen in a furnace at an elevated temperature of perhaps 1000° C. to produce an oxide layer 23 of a thickness of about 800 to 1000Å. Next, a layer 24 of silicon nitride of about 1000Å thickness is formed by exposing to an atmosphere of silane and ammonia in an rf plasma reactor. A coating 25 of photoresist is applied to the entire top surface of the slice, then exposed to ultraviolet light through a mask which defines the desired pattern of N+ regions 13, 14, 15 and 16, and developed. This leaves areas 26 where nitride is to be etched away by a nitride etchant which removes the exposed part of the nitride layer 24 but does not remove the oxide layer 23 and does not react with the photoresist 25.

If a channel stop is desired the slice may be now subjected to an ion implant step, whereby impurity atoms are introduced into regions of silicon not masked by photoresist 25, nitride 24 and/or oxide 23. The photoresist is preferably left in place as it masks the implant; the oxide layer 23 is left in place during the implant because it prevents the implanted atoms from out-diffusing from the surface during subsequent heat treatment. This implant is at a dosage of about $10^{15}/cm^2$ at 150 KeV.

The next step in the process is formation of field oxide 21 as seen in FIGS. 4b and 5b, which is done by subjecting the slice to steam or an oxidizing atmosphere at about 900° C. for perhaps 5 to 10 hours. This causes a thick field oxide region or layer 21 to be grown as seen in FIG. 4c, and this region extends into the silicon surface because silicon is consumed as it oxidizes. The remaining parts of the nitride layer 24 mask against oxidation. The thickness of this layer 21 is about 5000 to 10,000Å, about half of which is above the original surface and half below. The doped regions formed by the channel stop implant will be partly consumed, but will also diffuse further into the silicon ahead of the oxidation front.

The nitride layer 24 is removed by etching as well as the underlying oxide layer 23. In areas of the slice where depletion load devices are required, although not pertinent to this invention, a masked ion implant step would be done at this point. Also, windows for polysilicon to silicon contacts in peripheral circuitry would be patterned and etched at this point using photoresist, although none are needed in the ROM array itself. A gate insulator is applied by oxidation and patterned using photoresist. A layer of polycrystalline silicon as the first level polysilicon is deposited over the entire slice in a reactor using standard techniques, then doped with phosphorus to make it highly conductive. The polysilicon layer is next patterned by photoresist operation, creating the first level polysilicon used in other parts of the device but not in the ROM array.

Next, the device is subjected to an N+ diffusion wherein the column lines 13, 14, 15 and 16 are created, as well as the sources and drains of the transistors 10 in the array. The field oxide acts as a diffusion mask for this purpose, as seen in FIGS. 4c and 5c, the original oxide 23 having been removed. Phosphorus is deposited and then diffused to a depth of perhaps 8000Å.

Following the N+ diffusion, the pattern of gates for the cells 10 of the ROM array is created according to the invention. A photoresist layer 28 is applied to the surface of the slice then exposed to UV light through a mask which defines the ROM code, opening holes 29 where gates are to be created or potential MOS transistors are to be realized. Then, as seen in FIGS. 4d and 5d, the field oxide 21 is etched away in the holes 29, exposing the silicon wafer 20.

Next, the so-called interlevel oxide is grown, where in other parts of the device away from the ROM array the first level polysilicon is coated with thermal oxide to insulate first and second level polysilicon. In the ROM array, this interlevel oxide creates the gate oxide 22. As seen in FIGS. 4e and 5e, the oxide 22 of about 1000Å is grown in the areas where field oxide has been removed.

The second level polysilicon is next deposited, doped with phosphorus, perhaps by implant, then patterned using photoresist to create the row lines 11 and 12 as well as the gates of the transistors in the cell array.

To maximize density, the width of the second level polysilicon lines 11 and 12 is the same as the width of the holes 29 of FIGS. 4d and 5d, i.e., no overlap or oversize. Then, to avoid problems of exposed gate oxide, according to my U.S. Pat. No. 4,061,506, issued Dec. 6, 1977, assigned step whereby boron is implanted at a dosage of 2 to $3 \times 10^{12}/cm^2$, 50 to 70 KeV. This creates shallow P+ areas where the gate oxide 22 might be exposed due to misalignment of masks; the P+ areas cannot be easily inverted so the devices even though misaligned are not subject to failures caused by exposed thin oxide.

For other areas of the slice fabrication of the device is continued by depositing a thick layer 31 (not shown) of phosphorous-doped oxide in low temperature reaction process using conventional chemical vapor deposition techniques, covering the entire slice. Subsequently, windows are opened in this oxide layer in areas where contact is to be made to regions of the silicon or to the polysilicon layer using photoresist masking and etching. Then a layer of aluminum is deposited on the entire slice, for use as interconnections in peripheral circuitry but not in the ROM array, and patterned using photoresist masking to provide the desired metal interconnections. Ultimately, the slice is scribed and broken into individual chips, each perhaps 150 mils on a side, and the chips are mounted in suitable packages.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, comtemplated that the appended claims will cover any such modifications of embodiments as fall within the true scope of the invention.

What is claimed is:

1. A method of making a semiconductor device comprising the steps of masking a plurality of parallel elongated regions of a face of a semiconductor body against oxidation, growing thick field oxide in the spaces between the elongated regions but not above the elongated regions, removing small areas of the field oxide in a pattern according to where functioning transistors are to be created, forming thin gate dielectric in said small areas, and applying a plurality of parallel elongated conductive strips over the field oxide and gate dielectric in a direction normal to the elongated regions.

2. A method according to claim 1 wherein the semiconductor device is a read only memory and the field oxide is removed in a pattern of logic "1's" and "0's."

3. A method according to claim 2 wherein the semiconductor body is P-type silicon, the conductive strips are doped polycrystalline silicon, and the transistors are of the N-channel silicon gate type.

4. A method according to claim 3 wherein the elongated regions become N+ moats.

5. A method according to claim 4 wherein the field oxide is many times thicker than the gate dielectric.

6. A method of making a semiconductor device comprising the steps of: masking a plurality of elongated parallel areas on a face of a semiconductor wafer with a material which inhibits oxidation; growing a thick field oxide on said face while leaving unoxidized a plurality of elongted parallel regions; removing the masking material; introducing a conductivity type determining impurity into said face of said semiconductor wafer to heavily-dope the plurality of elongated regions; selectively removing the thick field oxide in areas between a plurality of the elongated regions; growing thin gate oxide in such areas; and providing a plurality of strips of conductive material over the field oxide generally perpendicular to the elongated regions extending across the plurality of areas.

7. A method according to claim 6 wherein the conductive material is doped polycrystalline silicon.

8. A method according to claim 7 wherein N-channel silicon gate MOS transistors are created at said plurality of areas.

9. A method according to claim 7 wherein the semiconductor device is a read only memory and the steps of selectively removing the thick field oxide programs the memory in a pattern of logic ones and zeros.

10. A method according to claim 7 wherein a silicon gate MOS transistors ae created at said selected areas.

11. A method of making an N-channel read only memory comprising the steps of: masking a plurality of elongated parallel areas on a face of a semiconductor body with a material which inhibits oxidationl; growing a thick field oxide on said face while leaving unoxidized a plurality of elongated parallel regions at said parallel areas; removing the masking material; introducing a conductivity type determining impurity into said face of the semiconductor body to heavily dope the plurality of elongated regions; selectively removing the thick field oxide in selected areas between a plurality of the elongated regions while leaving other such areas of field oxide intact to program the memory in a pattern of logic ones and zeros; forming thin gate dielectric in the selected areas; and providing a plurality of strips of conductive material over the field oxide generally perpendicular to the elongated regions extending across the selected areas.

12. A method according to claim 6 wherein the conductive material is polycrystalline silicon.

* * * * *